(12) United States Patent
Yang

(10) Patent No.: US 10,879,234 B2
(45) Date of Patent: *Dec. 29, 2020

(54) VERTICAL NOISE REDUCTION IN 3D STACKED SEMICONDUCTOR DEVICES

(71) Applicant: Taiwan Semiconductor Manufacturing Co., Ltd., Hsinchu (TW)

(72) Inventor: Shu-Chun Yang, Xihu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 72 days.

This patent is subject to a terminal disclaimer.

(21) Appl. No.: 16/195,104

(22) Filed: Nov. 19, 2018

(65) Prior Publication Data

US 2019/0088644 A1   Mar. 21, 2019

Related U.S. Application Data

(63) Continuation of application No. 14/038,800, filed on Sep. 27, 2013, now Pat. No. 10,134,729.

(51) Int. Cl.
*H01L 27/02* (2006.01)
*H01L 27/06* (2006.01)
*H01L 23/522* (2006.01)

(52) U.S. Cl.
CPC ...... *H01L 27/0688* (2013.01); *H01L 23/5222* (2013.01); *H01L 27/0248* (2013.01)

(58) Field of Classification Search
None
See application file for complete search history.

(56) References Cited

U.S. PATENT DOCUMENTS

| | | | |
|---|---|---|---|
| 5,489,792 A | 2/1996 | Hu et al. | |
| 8,477,554 B2 * | 7/2013 | Yu | G11C 5/063 365/226 |
| 10,134,729 B2 * | 11/2018 | Yang | H01L 27/0248 |
| 2003/0048616 A1 | 3/2003 | Ko | |
| 2003/0085776 A1 * | 5/2003 | Kim | H03H 1/0007 333/185 |
| 2005/0280084 A1 | 12/2005 | Morishita et al. | |
| 2010/0200924 A1 | 8/2010 | Furumiya | |
| 2012/0235259 A1 | 9/2012 | Fang | |

(Continued)

OTHER PUBLICATIONS

Muthana, et al., "I/O Decoupling in High Speed Packages Using Embedded Planar Capacitors", 2007, www.dupont.com. (U.S. Appl. No. 14/038,800).

*Primary Examiner* — Daniel Whalen
(74) *Attorney, Agent, or Firm* — Duane Morris LLP

(57) ABSTRACT

A stacked three dimensional semiconductor device includes multiple thin substrates stacked over one another and over a base substrate. The thin substrates may include a thickness of about 0.1 μm. In some embodiments, a noise suppression tier is vertically interposed between active device tiers. In some embodiments, each tier includes active device portions and noise suppression portions and the tiers are arranged such that noise suppression portions are vertically interposed between active device portions. The noise suppression portions include decoupling capacitors in a power/ground mesh and alleviate vertical noise.

20 Claims, 5 Drawing Sheets

(56) References Cited

U.S. PATENT DOCUMENTS

| | | | |
|---|---|---|---|
| 2013/0069132 A1* | 3/2013 | Atsumi | H01L 27/0688 257/301 |
| 2013/0134553 A1 | 5/2013 | Kuo et al. | |
| 2013/0299890 A1 | 11/2013 | Oh et al. | |
| 2013/0307119 A1 | 11/2013 | Chen et al. | |

* cited by examiner

US 10,879,234 B2

VERTICAL NOISE REDUCTION IN 3D STACKED SEMICONDUCTOR DEVICES

CROSS-REFERENCE TO RELATED APPLICATION

The present application is a continuation of U.S. patent application Ser. No. 14/038,800, filed on Sep. 27, 2013, which is incorporated by reference herein in its entirety.

TECHNICAL FIELD

The disclosure relates to stacked three dimensional semiconductor devices and, in particular, the disclosure relates to vertical noise reduction in stacked three dimensional semiconductor devices that utilize thin substrates.

BACKGROUND

In today's rapidly advancing semiconductor manufacturing industry, it is critical to increase integration levels to provide increased functionality within a given chip area. Stacked 3D technology represents a favored technology for increasing integration levels by stacking device levels over one another in one integrated unit. The use of thin substrates in the stacking layers enables greater levels of functionality to be utilized within a given space but as the thickness of the stacked substrates decreases, vertical noise between devices on different tiers or levels, manifests itself as an issue that needs to be addressed.

Decoupling capacitors also known as de-caps are devices that decouple electronic noise caused by various signals. Decoupling capacitors reduce noise in semiconductor devices by decoupling one part of an electrical circuit from other parts. Noise caused by other circuit elements is shunted through the capacitor, reducing the effect it has on the rest of the circuit. When decoupling capacitors are positioned in close proximity to circuit elements, they have maximum efficiency in reducing noise but can adversely affect performance by signal loading. In this case, the decoupling capacitors have good power integrity but poor signal integrity. If decoupling capacitors are sacrificed in the device layout to focus on signal integrity, then noise reduction by decoupling capacitors is diminished.

Various ESD (electrostatic discharge) protection devices are also used in the art. Typically, ESD protection devices and decoupling capacitors are located outside the periphery of the circuits or circuit blocks that combine to form a circuit. Because decoupling capacitors and other ESD protection devices are formed surrounding the circuit or a block portion of a circuit, they consume surface area either surrounding the entire circuit or the individual blocks of the circuit desired to be protected. The consumption of this space for decoupling capacitors or other ESD protection devices either increases the size of the chip required or comes at the expense of other functional device features.

It would be desirable to provide devices capable of alleviating noise in semiconductor devices and in particular vertical noise in stacked 3D technology semiconductor devices that utilize thin substrates.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a stacked three-dimensional (3D) semiconductor device that uses thin substrates in order to provide compact structures with high levels of integration. In order to suppress horizontal noise and also vertical noise between the closely compacted vertical layers, the disclosure provides decoupling capacitors and other noise suppression features in thin noise suppression layers or portions vertically disposed between active semiconductor device layers or portions. In some embodiments, the stacked semiconductor device includes multiple active layers and a noise suppression tier disposed between each set of vertically adjacent active device tiers. In other embodiments, each of the device levels includes at least one active portion and at least one noise suppression portion and the stacked 3D semiconductor device is formed such that noise suppression portions are vertically interposed between active device portions.

Figure 1:
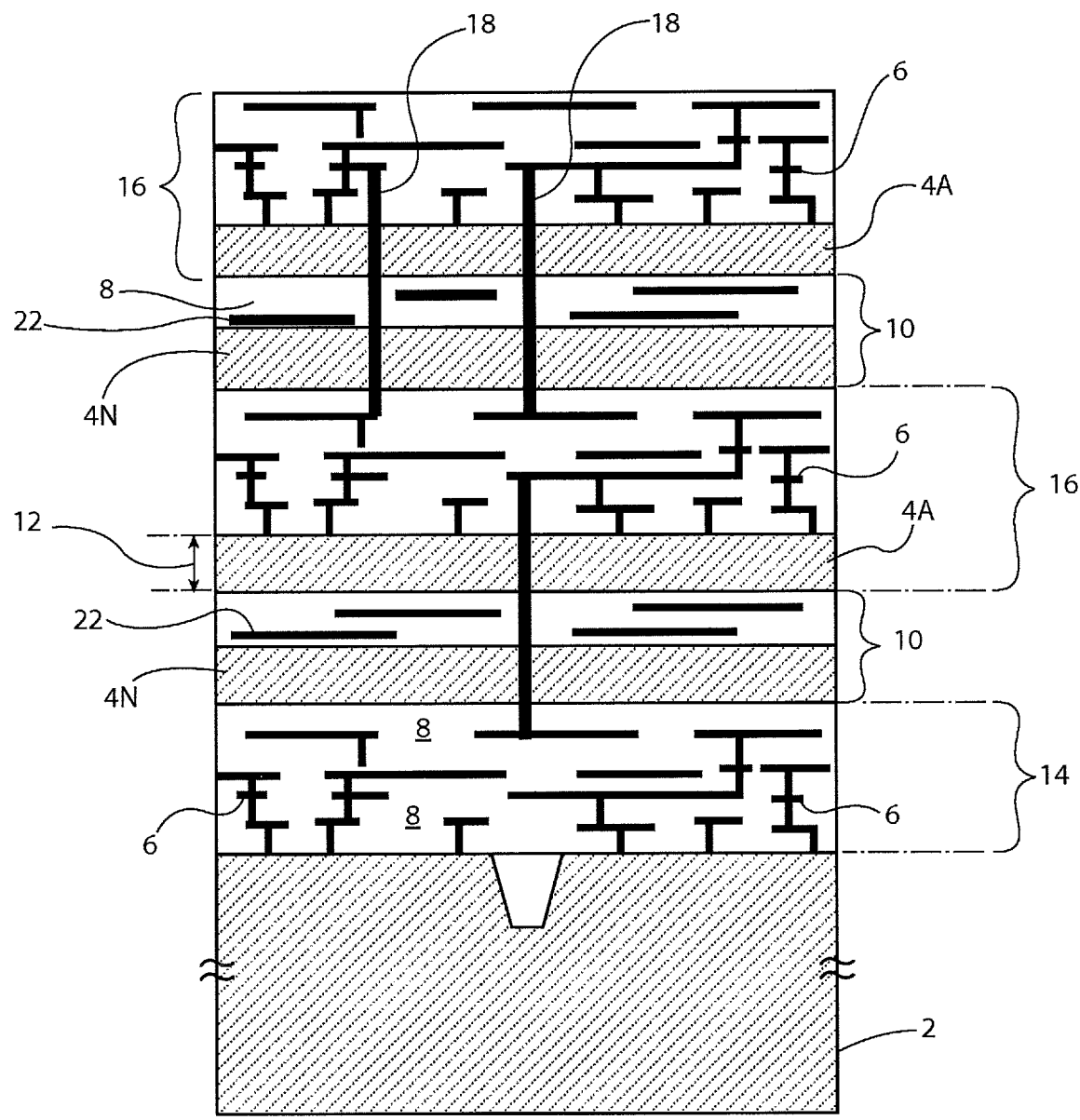
FIG. 1 is a cross sectional view showing noise suppression tiers interposed between actives tiers in a stacked 3D semiconductor device according to an embodiment of the disclosure.

FIG. 1 is a two-dimensional cross section of a stacked three-dimensional semiconductor device formed over base substrate 2. In some embodiments, base substrate 2 is a silicon wafer but other semiconductor materials and other substrates are used in other embodiments. Stacked over base substrate 2 are a number of thinner substrates 4A, 4N of the same lateral dimension. Active substrates 4A are substrates with active semiconductor devices thereon including active devices which generate noise in functional operation. Noise suppression substrates 4N are substrates that include a power/ground mesh and decoupling capacitors thereon or thereover and noise suppression substrates 4N may include active devices but are void of devices that generate electrical noise. The decoupling capacitors are metal-oxide-metal (MOM) capacitors, varactors, metal-insulator-metal (MIM) capacitors or metal-oxide-semiconductor (MOS) capacitors in various embodiments. Noise suppression substrates 4N may include active devices that do not generate electrical noise in functional operation such as varactors and metal-oxide-semiconductor (MOS) capacitors but other devices known as devices that do not generate electrical noise in functional operation are also used. The decoupling capacitors are formed in various circuit arrangements in the circuit in that includes the mesh of power and ground lines.

Any of various types of active semiconductor devices are formed in active device portion 14 over base substrate 2, and over each of active substrates 4A and include active devices known to generate electrical noise in functional operation such as transistors in memory read/write circuits or in any toggling circuit such as digital circuits or PLL (phase lock loop) or signal I/O circuit components.

The stacked 3D semiconductor device shown in FIG. 1 represents any of various types of technologies and various devices and therefore the active semiconductor devices formed on or in base substrate 2 and on substrate 4A, are representative of various types of active device components. Active semiconductor devices are also formed within dielectric material 8 which fills the region between base substrate 2 and substrate 4N and also fills the space between substrates 4A and 4N. Interconnect structures 6 connect active devices and other components. Active device portion 14 includes primary components of the stacked 3D semiconductor device in some embodiments. Substrates 4A, 4N are formed of silicon in some embodiments and are formed of other suitable substrate materials in other embodiments. In one embodiment, substrates 4A, 4N are formed of P-type silicon but other types of materials are used for substrates 4A and 4N in other embodiments. Substrates 4A, 4N include a thickness 12 that is on the order of about 0.1 μm in some embodiments but ranges from about 0.05 to 0.5 μm in other embodiments. In one embodiment, thickness 12 lies within a range of about 0.1 to about 0.2 μm.

Noise suppression substrates 4N and the materials thereover including a power/ground mesh and one or several decoupling capacitors, combine to form noise suppression tier 10. Noise suppression tier 10 includes wiring 22 that includes the power/ground mesh, decoupling capacitors formed within dielectric material 8 and as described above, and may also include active devices that do not generate electrical noise in functional operation such as varactors and metal-oxide-semiconductor (MOS) capacitors but other devices known as devices that do not generate electrical noise in functional operation are also used. Noise suppression tier 10 is a void of active semiconductor devices that generate noise in functional operation. Interlevel vias (ILV) 18 couple active devices from vertically separated active device tiers 16. Additional interlevel interconnect structures are used to couple active devices from the different tiers. Active device tiers 16 include active substrates 4A and a plurality of active semiconductor devices formed on or over the corresponding active substrate 4A and within dielectric 8. FIG. 1 shows that noise suppression tiers 10 are directly vertically interposed between vertically adjacent active device tiers 16 and also directly vertically positioned between active device portion 14 formed over base substrate 2, and lowermost active substrate 4A. Although four tiers are shown over base substrate 2 in FIG. 1, it should be understood that this represents one embodiment only and in other embodiments, other numbers of tiers are used.

Figure 2:
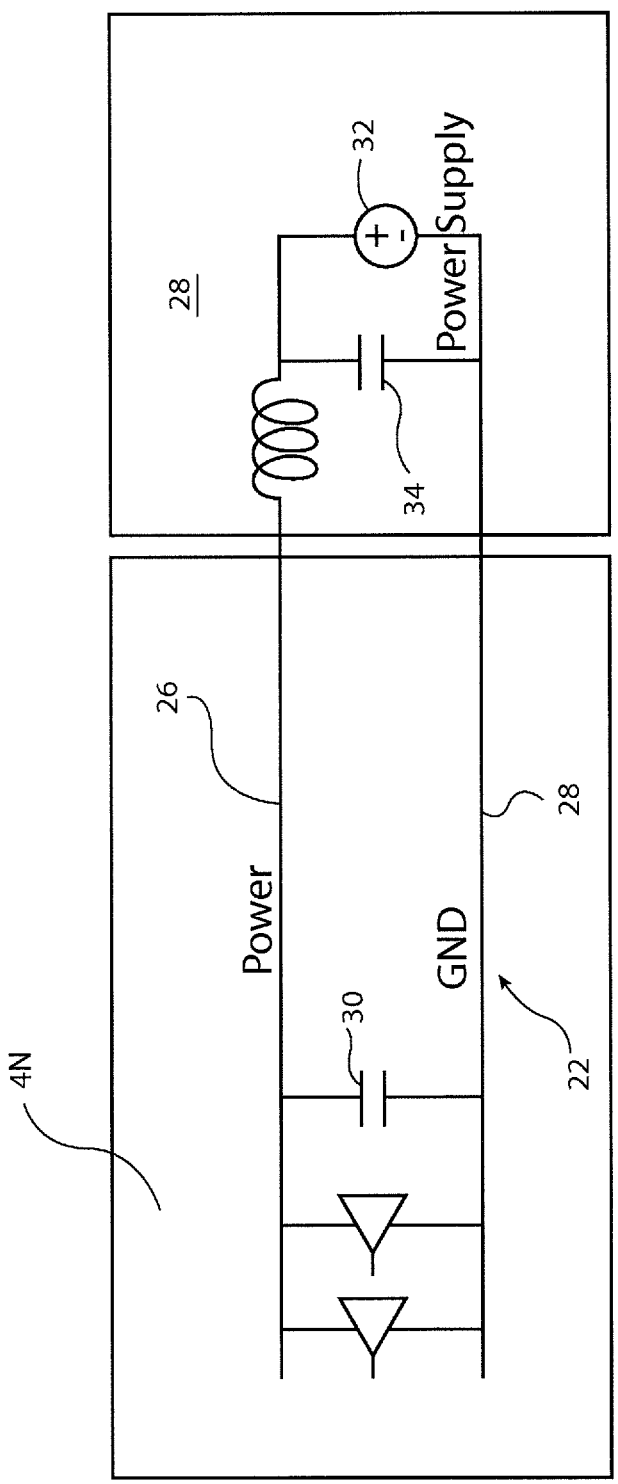
FIG. 2 is a circuit diagram showing a decoupling capacitor within a power/ground mesh according to an embodiment of the disclosure.

FIG. 2 is a circuit diagram showing an embodiment of an arrangement of a decoupling capacitor within a power/ground mesh such as formed over noise suppression substrate 4N in noise suppression tier 10. FIG. 2 shows components formed over noise suppression substrate 4N and includes wiring 22 including power line 26, and decoupling capacitor 30 interposed between power line 26 and ground line 28. In some embodiments, decoupling capacitor 30 is a varactor and in other embodiments, decoupling capacitor 30 is an MOS (metal oxide semiconductor) capacitor or an MIM (metal insulator metal) capacitor or an MOM (metal oxide metal) capacitor. Other suitable capacitors are used in other embodiments. Off-chip component 28 includes power supply 32 and represents a probe card, package or PCB environment in various embodiments and illustrates one embodiment of a wiring arrangement that includes off-chip decoupling capacitor 34. The coupling arrangement in FIG. 2 represents a coupling according to one embodiment only and in other embodiments, decoupling capacitor 30 is positioned in various different locations within the power/ground mesh formed in noise suppression tier 10.

Figure 3:
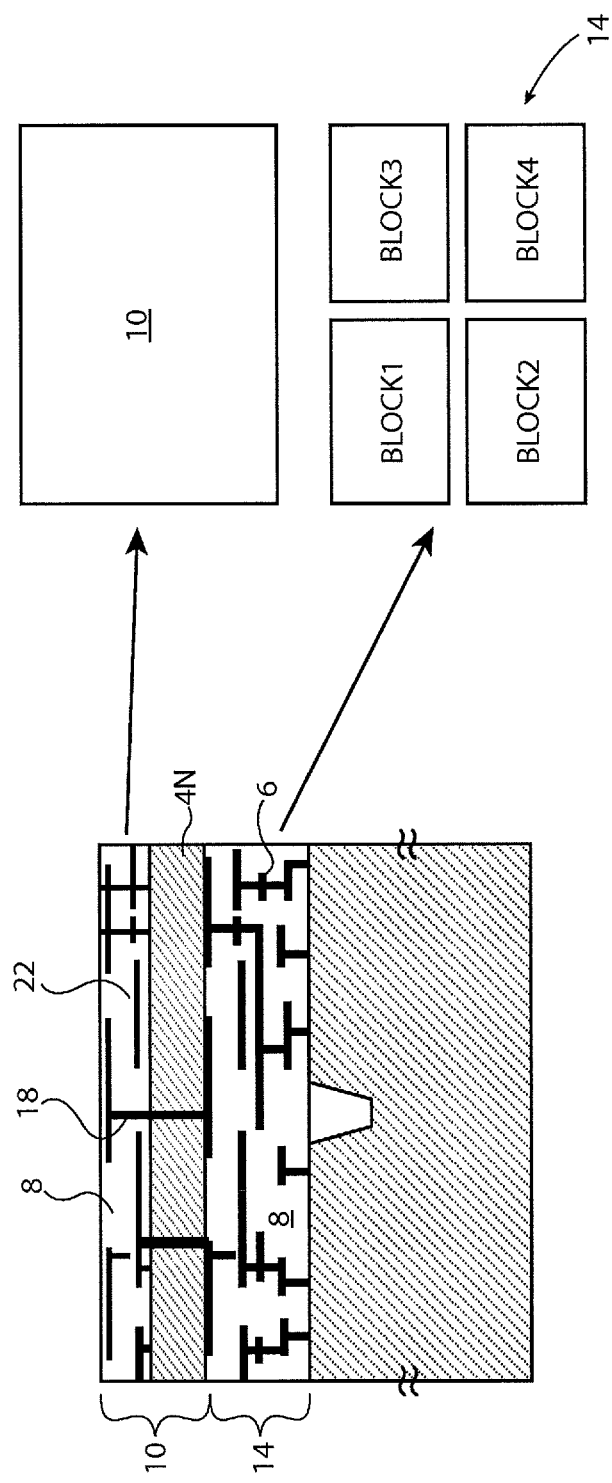
FIG. 3 is a cross-sectional view also showing components in plan-view and illustrating a noise suppression tier according to an embodiment of the disclosure.

FIG. 3 shows a cross-section of a portion of a stacked 3D semiconductor device. FIG. 3 shows base substrate 2 with active device portion 14 formed thereover. Active device portion 14 includes active semiconductor devices formed on or in within base substrate 2 and within dielectric material 8 and also includes interconnect structures 6. Noise suppression tier 10 including noise suppression substrate 4N is formed over active device portion 14. Active device portion 14 includes primary components of the stacked 3D semiconductor device. Noise suppression tier 10 is disposed directly over active device portion 14 and includes wiring 22 that includes a power/ground mesh and decoupling capacitors (not shown in the plan view on the right-hand side of FIG. 3) and may also include active devices that do not generate noise in functional operation. Interlevel vias 18 couple components from active device portion 14 to components of noise suppression tier 10. FIG. 3 also shows that active device portion 14 as shown in the plan view on the right-hand side of FIG. 3, includes multiple circuit blocks ("block 1", "block 2", "block 3", "block 4") and the individual circuit blocks 1-4 are laterally adjacent one another and do not require a peripheral portion dedicated to noise suppression components.

Figure 4:
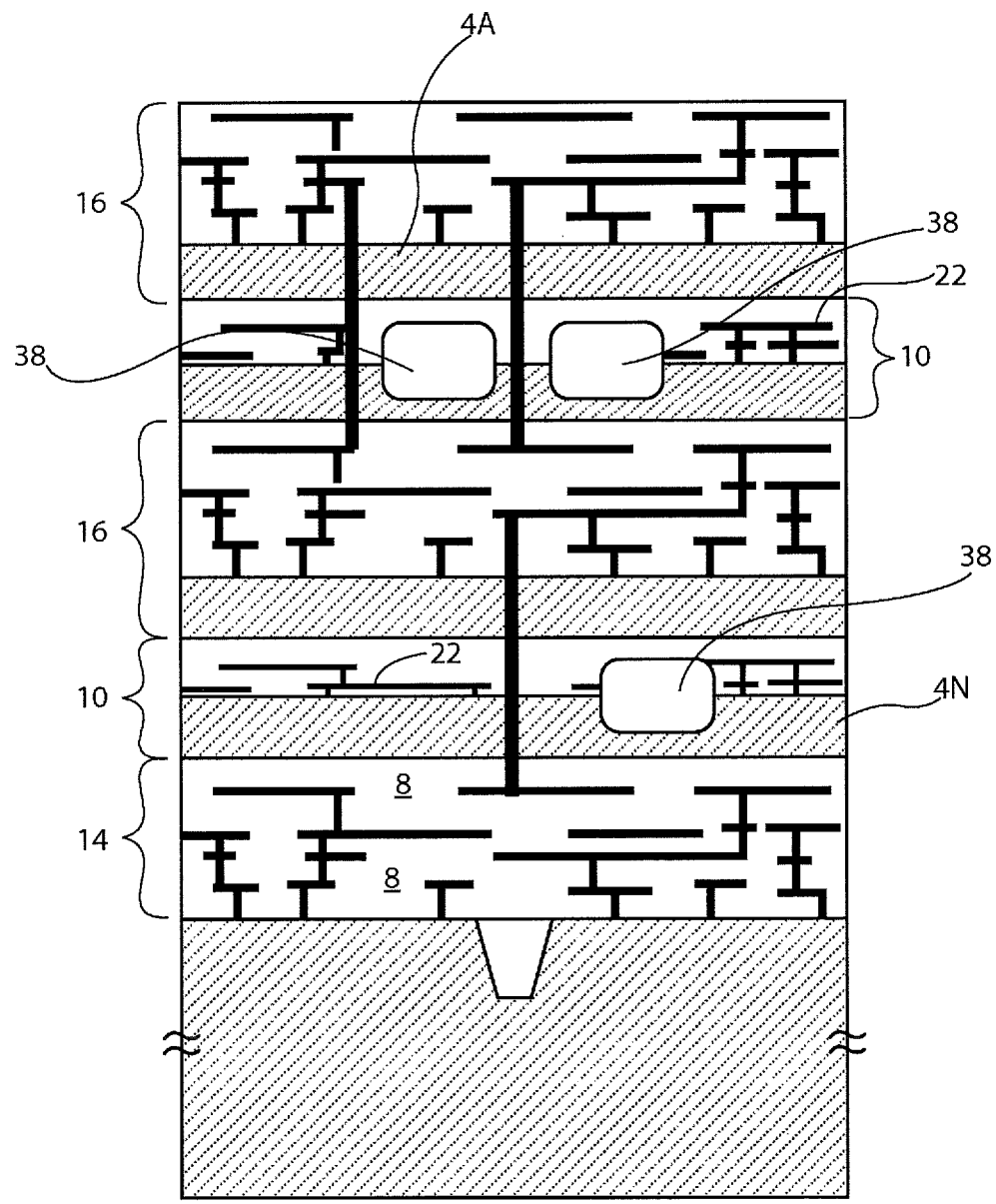
FIG. 4 is a cross-sectional view showing another embodiment of the disclosure including noise suppression tiers with additional ESD protection diodes according another embodiment of disclosure.

FIG. 4 shows an embodiment similar to the embodiment of FIG. 1 and includes active device portion 14, noise suppression tiers 10 and active tiers 16. In the embodiment of FIG. 4, noise suppression tiers 10 additionally include various additional noise suppression features and in some embodiments, noise suppression tiers 10 additionally include ESD protect features 38. In some embodiments, ESD protect features 38 are ESD diodes or rail clamps such as power rail clamps or other EDS suppression devices and according to this embodiment, the additional noise protect features 38 do not take up any real estate that would otherwise be used for active device features although in other embodiments, such additional ESD protection devices are included in active device portions 14. According to the embodiment in which ESD diodes/rail clamps are used, these features are only active when electrostatic generation arises and do not generate any noise in normal operation. In the embodiment of FIG. 4, wiring 22 of noise suppression tiers 10 therefore includes the power/ground mesh, ESD protect features 38, decoupling capacitors (not shown) and do not include active semiconductor devices that do not generate electrical noise in functional operation.

Figure 5:
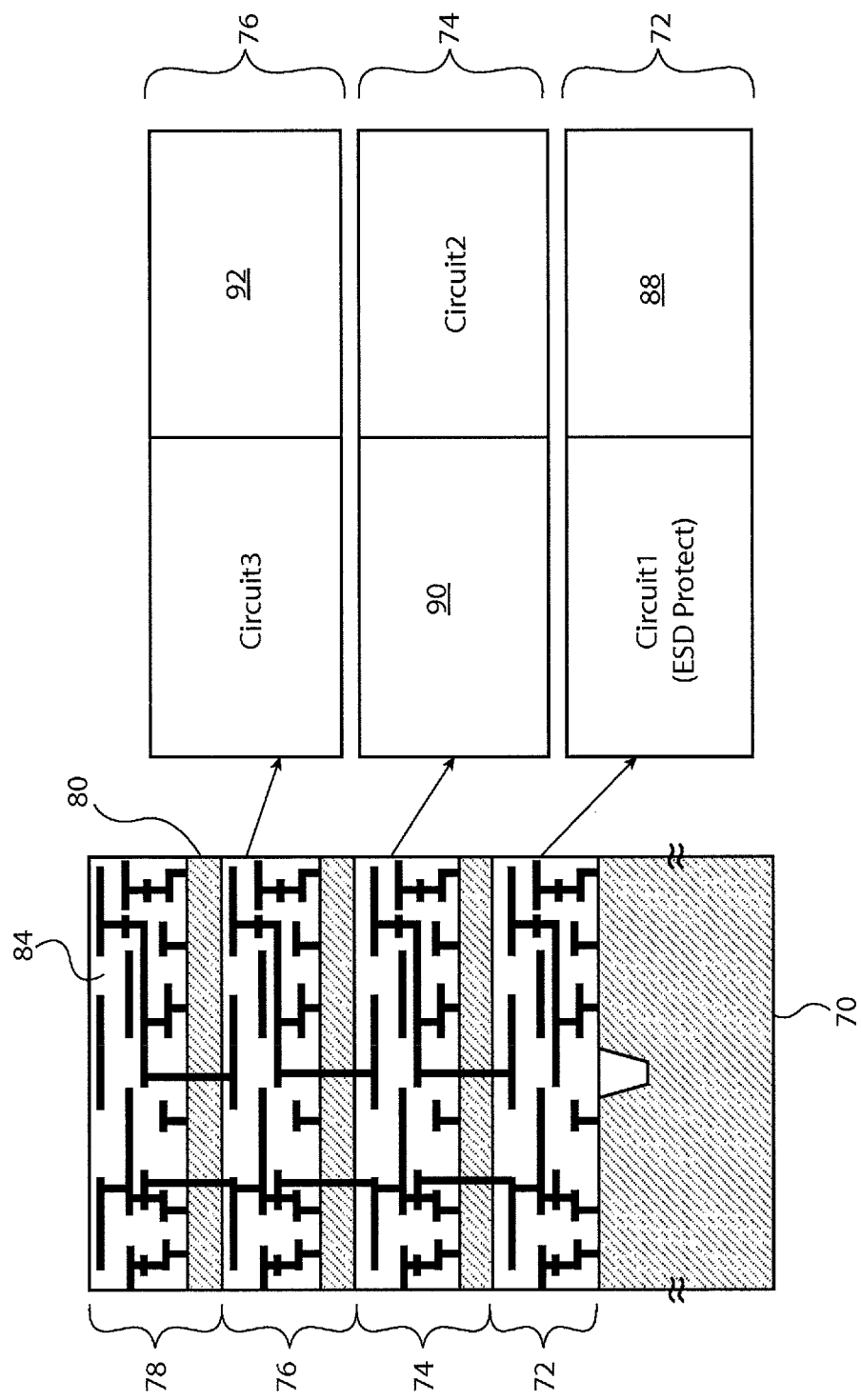
FIG. 5 is a cross-sectional view showing another embodiment of a stacked 3D semiconductor device with noise suppression portions vertically interposed between active device portions.

FIG. 5 shows another embodiment of the disclosure. In FIG. 5, each tier includes both active device portions and noise suppression portions. In the stacked 3D semiconductor device, the noise suppression portions are interposed between vertically adjacent active device portions.

FIG. 5 shows base substrate 70 with device levels 72, 74, 76 and 78 disposed over base substrate 70. Device level 74 is considered the second tier, device level 76 is considered the third tier and device level 78 is considered the fourth tier in the illustrated embodiment but additional or fewer device tiers are used in other embodiments. Each device tier includes substrate 80. In some embodiments, substrate 80 is a p-type silicon substrate having a thickness of about 0.1 to about 0.2 µm but other materials and other thicknesses are used in other embodiments. Each device tier also includes components formed thereover and dielectric material 84 filling the space between the respective tiers.

The embodiment of FIG. 5 is distinguished from the embodiment shown in FIGS. 1 and 4 because each device level 72, 74, 76 and 78 includes both active circuit portions and noise suppression portions. The noise suppression portions and active device portions are laterally adjacent one another on each device level 72, 74, 76, 78 and the noise suppression portions are directly vertically interposed between vertically adjacent active portions. Device level 72, i.e. the "first tier" includes an active device portion ("Circuit 1") and noise suppression portion 88. Device level 74, i.e. "the second tier" includes active device portion "Circuit 2" and also noise suppression portion 90. Device level 76, i.e. "the third tier" includes active device portion "Circuit 3" and noise suppression portion 92. The right-hand side of FIG. 5 illustrates that the various device levels 72, 74, 76, 78 are arranged such that a noise suppression portion is vertically interposed between vertically adjacent active device portions. For example, noise suppression 90 of device level 74 is vertically interposed between active device portions "Circuit 1" and "Circuit 3" formed in device levels 72 and 76, respectively. In other embodiments, each device level includes multiple active device portions and multiple noise suppression portions and in some embodiments, the portions are arranged in a checkerboard fashion. In the embodiments in which multiple active device portions and multiple noise suppression portions are present in each device level, the device levels are arranged such that a noise suppression portion is vertically interposed between a subjacent and superjacent active device portion. In some embodiments, each set of vertically adjacent active device portions is separated by a noise suppression portion.

Noise suppression portions 88, 90 and 92 are similar to the noise suppression tier 10 as described above. In each of the described embodiments, the noise suppression level or portion suppresses vertical noise from the active device layers of portions.

According to one aspect, a stacked three dimensional semiconductor device is provided. The device comprises a plurality of tiers stacked over one another, each including a substrate and a layer of insulating material formed thereover, the plurality of tiers including active tiers and noise suppression tiers. The active tiers include active semiconductor devices and the noise suppression tiers include a power/ground mesh and decoupling capacitors and no active semiconductor devices that generate electrical noise in functional operation. At least one noise suppression tier is vertically interposed between two of the active tiers and the power/ground mesh is connected to circuitry of the active devices formed on the active tiers.

In some embodiments, the substrates each include a thickness of about 0.1 µm.

In some embodiments, the plurality of stacked tiers includes a noise suppression tier vertically interposed between each duality of vertically adjacent active tiers.

In some embodiments, the plurality of tiers is stacked over a base substrate.

In some embodiments, the base substrate comprises a silicon wafer and at least one noise suppression tier is vertically interposed directly between two of the active tiers.

In some embodiments, the decoupling capacitors comprise varactors.

In some embodiments, the decoupling capacitors comprise at least one of MOS (metal oxide semiconductor) capacitors, MIM (metal insulator metal) capacitors and MOM (metal oxide metal) capacitors.

In some embodiments, each substrate comprises a p-type silicon substrate.

In some embodiments, each p-silicon substrate includes a thickness within a range of about 0.1 µm to about 0.2 µm.

In some embodiments, the noise suppression tiers further comprise at least one of rail clamps and ESD (electrostatic discharge) diodes.

In another aspect, a stacked 3D semiconductor device comprises a plurality of tiers stacked over one another, each including a substrate and a layer of insulating material thereover. Each substrate includes at least one active device portion with active devices and at least one noise suppression portion with decoupling capacitors and a power/ground mesh thereon and no active devices that generate electrical noise in functional operation thereon. The tiers are stacked over one another such that at least one noise suppression portion of one substrate is vertically interposed between active portions of subjacent and superjacent ones of the substrates.

In some embodiments, some of the active device portions include ESD protection devices thereon.

In some embodiments, at least one substrate includes a plurality of active device portion and a plurality of noise suppression portions, wherein the noise suppression portion are laterally interposed between the active device portions.

In some embodiments, the plurality of stacked tiers includes one noise suppression portion directly vertically interposed between each duality of vertically adjacent ones of the active device portions.

In some embodiments, the substrates each include a thickness in a range of about 0.1 µm to about 0.2 µm.

In some embodiments, the decoupling capacitors comprise varactors or MOS (metal oxide semiconductor) capacitors.

In some embodiments, the decoupling capacitors comprise at least one of MOS (metal oxide semiconductor) capacitors, MIM (metal insulator metal) capacitors and MOM (metal oxide metal) capacitors and the noise suppression tiers further include rail clamps and/or ESD (electrostatic discharge) diodes.

In some embodiments, the substrate comprises a p-type silicon substrate and has a thickness of about 0.1 µm and the plurality of tiers are disposed on a base substrate that includes active semiconductor devices and at least one ESD (electrostatic discharge) diode thereon.

According to another aspect, a stacked 3D semiconductor device is provided and comprises: a plurality of tiers stacked over one another, each including a semiconductor substrate and a layer of insulating material thereover, each semiconductor substrate including at least one active device portion with active devices thereon and at least one noise suppression portion with decoupling capacitors, a power/ground mesh and no active devices that generate electrical noise in functional operation thereon. The tiers are stacked over one another such that at least one noise suppression portion of one substrate is vertically interposed between active portions of subjacent and superjacent ones of the substrates. The semiconductor substrates have a thickness less than about 0.2 µm, and at least some of the decoupling capacitors are coupled between ground and a power line.

In some embodiments, the noise suppression portions further include at least rail clamps, ESD (electrostatic discharge) diodes, or both.

The preceding merely illustrates the principles of the disclosure. It will thus be appreciated that those of ordinary skill in the art will be able to device various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A device comprising:
    a plurality of tiers stacked over one another, the plurality of tiers each including active device portions and noise suppression portions, the active device portions including active semiconductor devices and the noise suppression portions including a power/ground mesh and decoupling capacitors,
    wherein at least a first one of the noise suppression portions in a first one of the tiers is laterally adjacent to at least one active device portion in the first one of the tiers, a second one of the active device portions in a second one of the tiers, vertically above or below the first one of the tiers, is directly above or below and coextensive with the at least a first one of the noise suppression portions in the first one of the tiers, and at least two third ones of the active device portions in a third one of the tiers, vertically above or below the first one of the tiers, is directly above or below and coextensive with the at least a first one of the noise suppression portions of the first one of the tiers.

2. The device of claim 1, wherein each tier includes a semiconductor substrate and a layer of insulating material formed thereover.

3. The device of claim 2, wherein the semiconductor substrate has a thickness of about 0.1 µm.

4. The device of claim 1, wherein the active device portions and the noise suppression portions in one of the plurality of tiers are arranged in a laterally adjacent checkerboard fashion.

5. The device of claim 1, wherein said decoupling capacitors comprise one of varactors and MOS (metal oxide semiconductor) capacitors.

6. The device of claim 1, wherein said decoupling capacitors comprise at least one of MOS (metal oxide semiconductor) capacitors, MIM (metal insulator metal) capacitors and MOM (metal oxide metal) capacitors.

7. The device of claim 1, wherein the noise suppression portions further comprise at least one of rail clamps and ESD (electrostatic discharge) diodes.

8. A device comprising:
    a first noise suppression portion in a first tier laterally adjacent to a first active device portion in the first tier;
    a second active device portion in a second tier, vertically above or below the first tier, wherein the second active device portion is directly above or below and coextensive with the first noise suppression portion; and
    at least two third active device portions in a third tier, vertically above or below the first tier, wherein the at least two third active device portions are directly above or below and coextensive with the first noise suppression portion.

9. The device of claim 8, wherein the first noise suppression portion has no active devices that generate electrical noise in functional operation thereon.

10. The device of claim 8, wherein the first noise suppression portion comprises decoupling capacitors and a power/ground mesh.

11. The device of claim 10, wherein said decoupling capacitors comprise varactors.

12. The device of claim 10, wherein said decoupling capacitors comprise at least one of MOS (metal oxide semiconductor) capacitors, MIM (metal insulator metal) capacitors and MOM (metal oxide metal) capacitors.

13. The device of claim 8, wherein the first active device portion comprises at least one active device.

14. The device of claim 8, wherein the first tier, the second tier, and the third tier are part of a plurality of tiers stacked over one another, each tier including a substrate and a layer of insulating material thereover.

15. The device of claim 14, wherein each substrate includes a thickness in a range of about 0.1 µm to about 0.2 µm.

16. The device of claim 14, wherein said substrate comprises a p-type silicon substrate and has a thickness of about 0.1 µm.

17. A method, comprising:
    locating a first noise suppression portion in a first tier laterally adjacent to a first active device portion in the first tier;
    locating a second active device portion in a second tier, vertically above or below the first tier, wherein the second active device portion is directly above or below and coextensive with the first noise suppression portion; and
    locating a third active device portion in a third tier, vertically above or below the first tier, wherein the third active device portion is directly above or below and coextensive with the first noise suppression portion.

18. The method of claim 17, wherein the first noise suppression portion further includes at least one of rail clamps and ESD (electrostatic discharge) diodes.

19. The method of claim 17, wherein the first noise suppression portion and the first active device portion are arranged in a laterally adjacent checkerboard fashion on a surface of a substrate of the first tier.

20. The method of claim 17, wherein the first tier, the second tier, and the third tier are all stacked over a base substrate that includes further active semiconductor devices thereon.

\* \* \* \* \*